(12) United States Patent
Zhou et al.

(10) Patent No.: US 12,207,450 B2
(45) Date of Patent: *Jan. 21, 2025

(54) COLD PLATES INCORPORATING REACTIVE MULTILAYER SYSTEMS AND S-CELLS

(71) Applicant: Toyota Motor Engineering & Manufacturing North America Inc., Plano, TX (US)

(72) Inventors: Feng Zhou, Ann Arbor, MI (US); Hiroshi Ukegawa, South Lyon, MI (US)

(73) Assignee: Toyota Motor Engineering & Manufacturing North America Inc., Plano, TX (US)

( * ) Notice: Subject to any disclaimer, the term of this patent is extended or adjusted under 35 U.S.C. 154(b) by 179 days.

This patent is subject to a terminal disclaimer.

(21) Appl. No.: 17/820,959

(22) Filed: Aug. 19, 2022

(65) Prior Publication Data

US 2024/0064943 A1 Feb. 22, 2024

(51) Int. Cl.
*H05K 7/20* (2006.01)
*H01L 23/00* (2006.01)
*H01L 23/473* (2006.01)
*H01L 25/065* (2023.01)

(52) U.S. Cl.
CPC ....... *H05K 7/20927* (2013.01); *H01L 23/473* (2013.01); *H01L 24/32* (2013.01); *H01L 24/72* (2013.01); *H01L 25/0655* (2013.01); *H01L 24/73* (2013.01); *H01L 2224/32225* (2013.01); *H01L 2224/72* (2013.01); *H01L 2224/73251* (2013.01); *H01L 2924/15153* (2013.01); *H01L 2924/1517* (2013.01); *H01L 2924/15793* (2013.01)

(58) Field of Classification Search
CPC ............ H05K 7/20254; H05K 7/20927; H01L 23/473
See application file for complete search history.

(56) References Cited

U.S. PATENT DOCUMENTS

| | | | |
|---|---|---|---|
| 5,381,944 A | 1/1995 | Mokowiecki et al. | |
| 8,299,630 B2 | 10/2012 | Braeuer et al. | |
| 9,693,488 B2* | 6/2017 | Singh | H05K 7/20927 |
| 10,236,791 B1* | 3/2019 | Chung | H02M 7/53875 |
| 2009/0186195 A1 | 7/2009 | Spraker et al. | |
| 2012/0014059 A1* | 1/2012 | Zeng | H05K 5/065 |
| | | | 361/730 |
| 2014/0004389 A1* | 1/2014 | Schaefer | H01M 10/4257 |
| | | | 429/61 |
| 2016/0209133 A1* | 7/2016 | Hu | H01L 21/4882 |
| 2023/0139202 A1* | 5/2023 | Zhou | H05K 7/20254 |
| | | | 361/699 |
| 2023/0307406 A1* | 9/2023 | Zhou | H05K 7/20927 |

FOREIGN PATENT DOCUMENTS

| | | | |
|---|---|---|---|
| DE | 102012110542 B4 | 4/2017 | |
| DE | 102012110549 B4 | 1/2019 | |

* cited by examiner

*Primary Examiner* — Zachary Pape
(74) *Attorney, Agent, or Firm* — Dinsmore & Shohl LLP

(57) ABSTRACT

Cold plate assemblies, power electronics assemblies including the same, and power electronics systems including the same are disclosed. A cold plate includes an S-cell disposed within a cavity of the cold plate and at least one reactive multilayer system interposed between the S-cell and a base wall of the cavity.

20 Claims, 6 Drawing Sheets

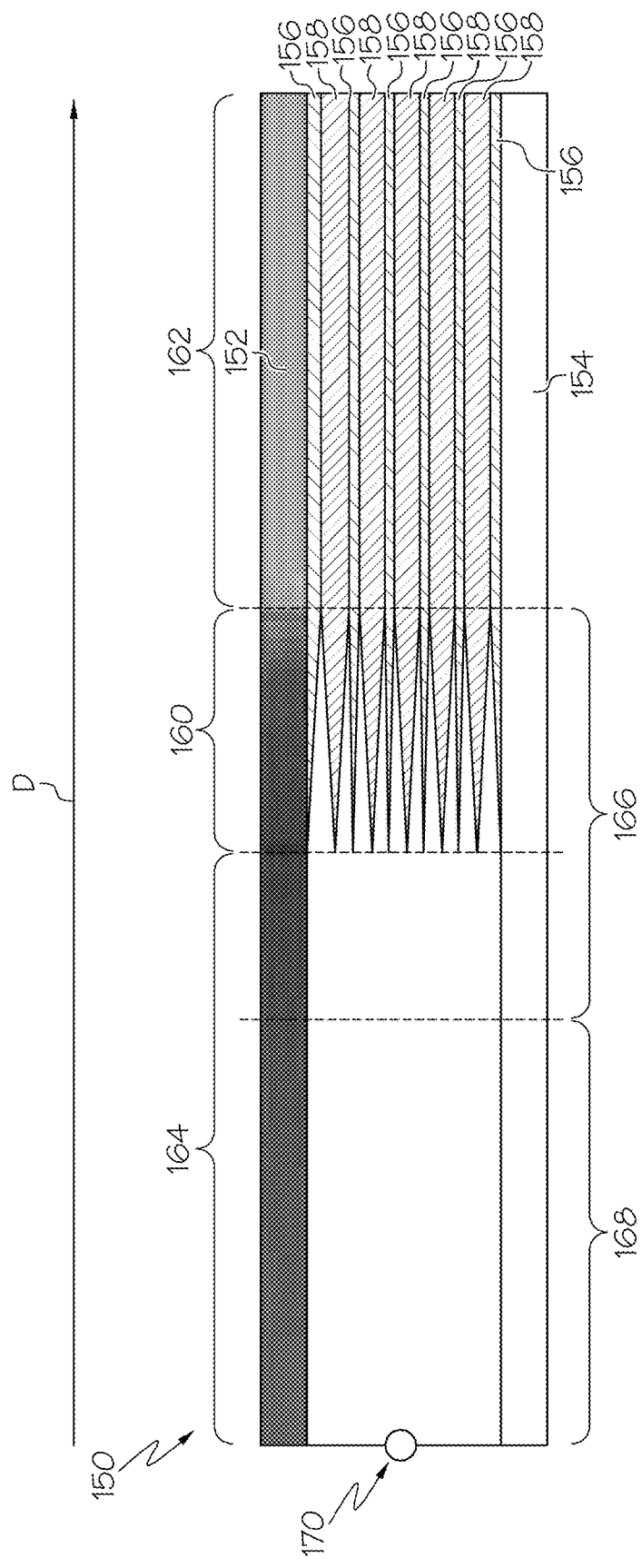

COLD PLATES INCORPORATING REACTIVE MULTILAYER SYSTEMS AND S-CELLS

TECHNICAL FIELD

The present specification generally relates to power electronic assemblies and, more specifically, to cooling devices for power electronic assemblies.

BACKGROUND

Due to the increased use of electronics in vehicles, there is a need to make electronic systems more compact. One component of these electronic systems is a power electronic device used as a switch in an inverter. Power electronic devices have large cooling requirements due to the heat generated.

Additionally, there has been a trend for power electronic devices conventionally composed of silicon to now be composed of silicon-carbide. The use of silicon-carbide causes a larger heat flux due to it defining a smaller device footprint. For these reasons, and more, there is a need to improve the cooling of power electronic devices while maintaining a compact package size.

SUMMARY

In one aspect, a cold plate includes an S-cell disposed within a cavity of the cold plate and at least one reactive multilayer system interposed between the S-cell and a base wall of the cavity.

In another aspect, a power electronics device assembly includes a cold plate defining a cavity. The cold plate includes an S-cell disposed within the cavity of the cold plate that defines a recess. The cold plate further includes at least one reactive multilayer system interposed between the S-cell and a base wall of the cavity. The at least one reactive multilayer system bonds the S-cell to the cold plate within the cavity. The power electronics device assembly further includes a power electronics device received within the recess of the S-cell.

In yet another aspect, a power electronics system includes a circuit board assembly and a power electronics assembly coupled to the circuit board assembly. The power electronics assembly includes a cold plate defining a cavity. The cold plate includes an S-cell disposed within the cavity of the cold plate and defining a recess. The cold plate further includes at least one reactive multilayer system interposed between the S-cell and a base wall of the cavity. The at least one reactive multilayer system bonds the S-cell to the cold plate within the cavity. The power electronics assembly further includes a power electronics device received within the recess of the S-cell.

These and additional features provided by the aspects and embodiments described herein will be more fully understood in view of the following detailed description, in conjunction with the drawings.

BRIEF DESCRIPTION OF THE DRAWINGS

The aspects and embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 7 schematically illustrates a cross-sectional view of a reactive multilayer system proceeding from an unreacted state to a reacted state according to one or more embodiments described and illustrated herein.

DETAILED DESCRIPTION

Figure 1:
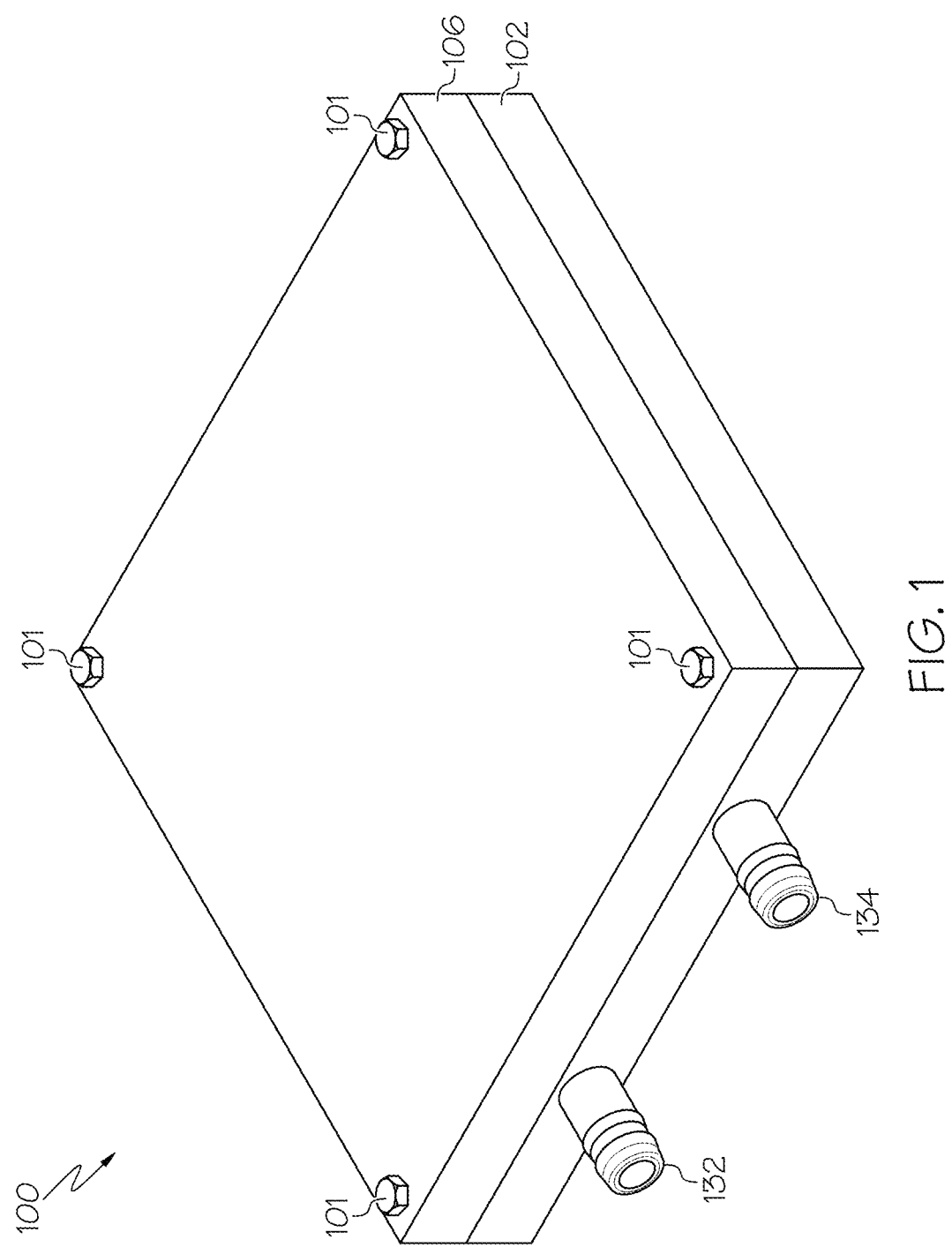
FIG. 1 schematically depicts a perspective view of an illustrative power electronics system according to one or more embodiments described and illustrated herein.

Embodiments described herein are generally directed to power electronics systems having a circuit board assembly coupled to a power electronics device assembly that includes a cold plate containing an S-cell. A power electronics device may be embedded within the S-cell and/or within the circuit board assembly.

The power electronics devices assemblies of the present disclosure include a power electronics device affixed to a mounting substrate referred to herein as an S-cell. As described in more detail below, the S-cell includes an electrically insulating layer that electrically insulates the bottom electrodes of the power electronics device from other components of the power electronics device assembly. For example, the integral electrically insulating layer of the S-cell enables the removal of an electrical insulation layer between the printed circuit board and the cold plate because the electrical isolation is provided by the S-cell itself.

As described in more detail below, the S-cells of the present disclosure provide enhanced thermal properties due to graphite layers that promote heat flux flow toward a cold plate. The S-cells described herein include stacked metal, graphite, and one or more electrically insulating layers in a compact package. The bonding materials described herein for bonding the S-cells are particularly adapted for increased thermal conductivity relative to other bonding technologies, while also maintaining an ability of electrically insulate the S-cells. More specifically, a reactive multilayer system (RMS) is used to bond S-cells to cold plates and/or to bond the power electronics devices to the S-cells. The RMS provides electrical insulation for each S-cell, but has a low thermal conductivity. This may result in decreased thermal flux from the S-cell to the cold plate. The devices, systems, and apparatuses described herein improves the heat flux from the S-cell to the cold plate, thereby increasing heat spreading and cooling performance for the PCB.

The cold plates, power electronics device assemblies, circuit board assemblies, power electronics systems, and the like described herein may be used in electrified vehicles, such as and without being limited to, an electric vehicle, a hybrid electric vehicle, any electric motor, generators, industrial tools, household appliances, and the like. The various assemblies described herein may be electrically coupled to an electric motor and/or a battery, and may be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when a power electronics device assembly is fully embedded by a circuit board substrate, it means that the material of the circuit board substrate covers each surface of the circuit board substrate. A component is "partially embedded" when one or more surfaces of the component are exposed.

As used herein, an "S-cell" is a mounting substrate operable to be affixed to a power electronics device, inserted within a cavity of a cold plate, and includes one or more of a metal layer, a graphite layer and an electrically insulating layer.

Various embodiments of power electronics device assemblies and power electronics systems, and cold plates are described in detail below. Whenever possible, the same reference numerals will be used throughout the drawings to refer to the same or like parts.

Figure 2:
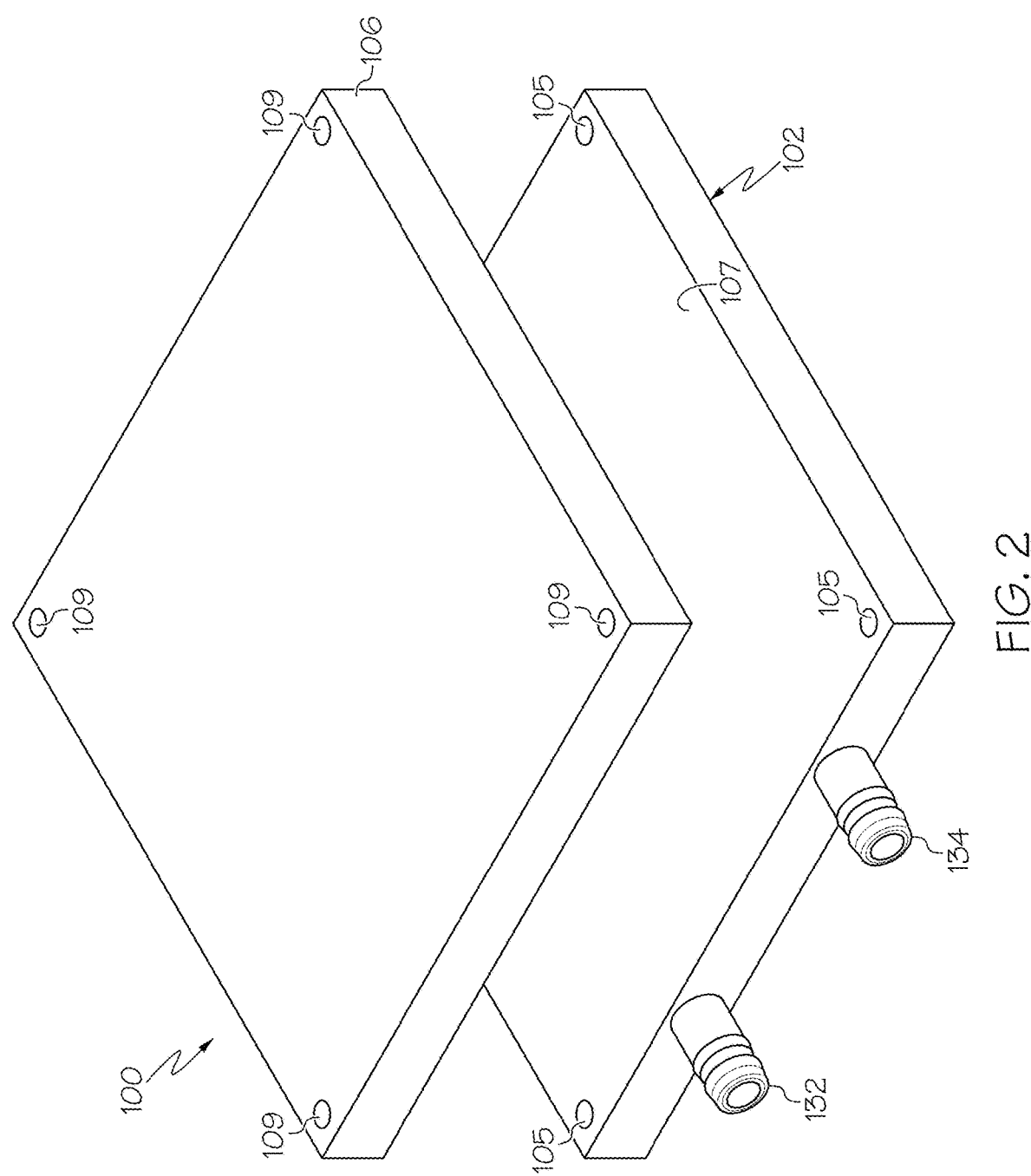
FIG. 2 schematically depicts an exploded perspective view of the power electronics system illustrated by FIG. 1 according to one or more embodiments described and illustrated herein.
Figure 3:
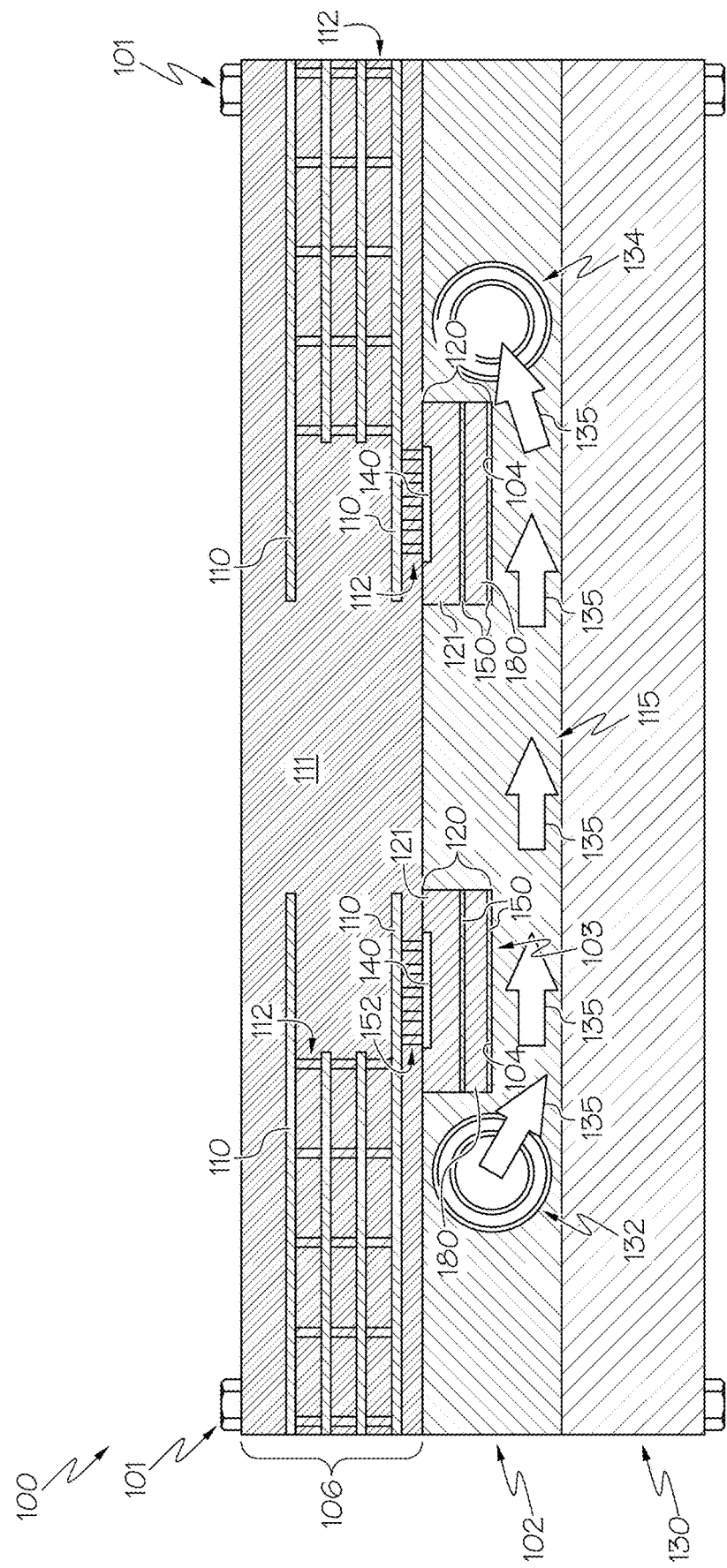
FIG. 3 schematically depicts a cross-sectional view of an illustrative power electronics system according to one or more embodiments described and illustrated herein.
Figure 6:
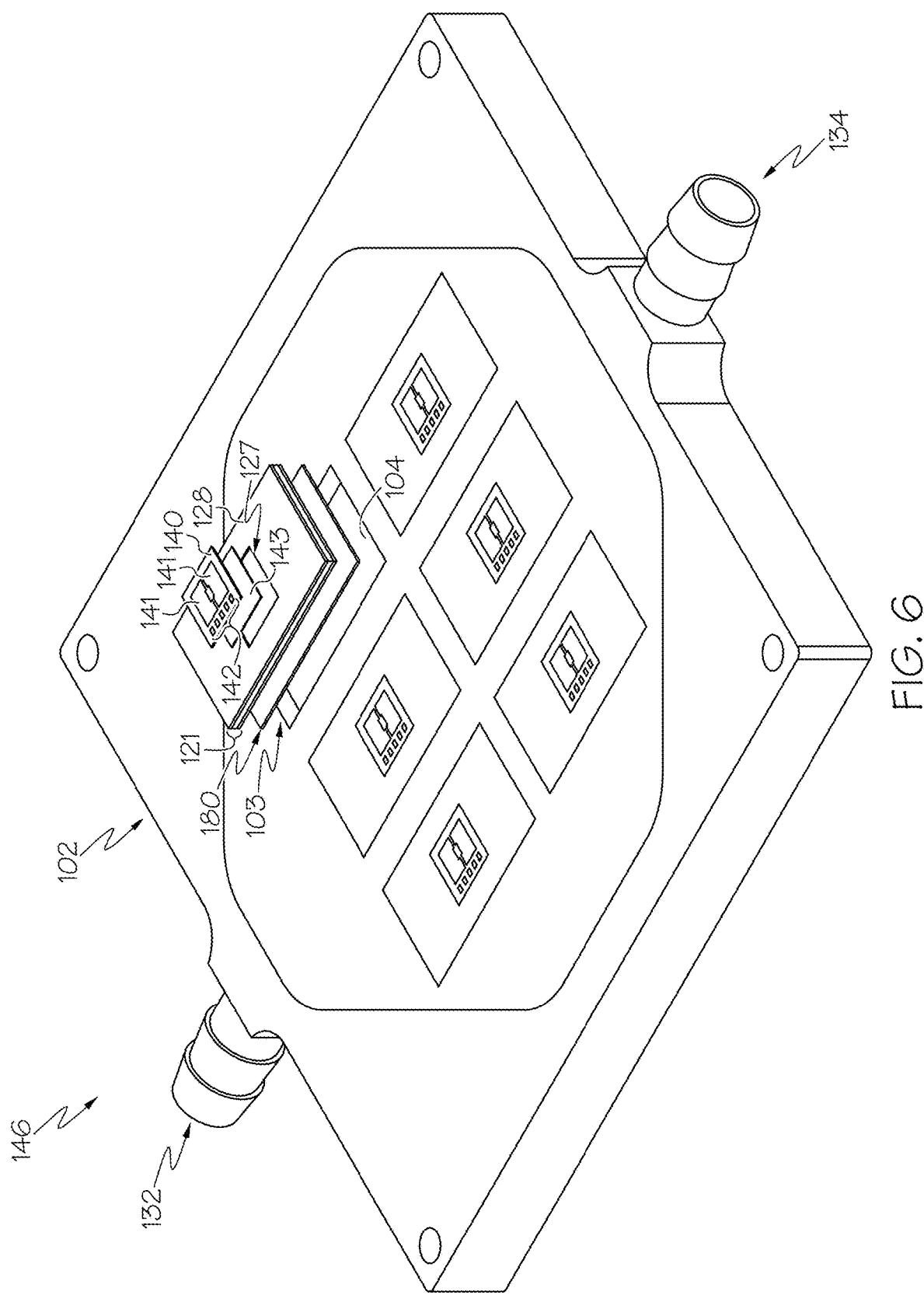
FIG. 6 schematically illustrates a top exploded perspective view of an illustrative cold plate having a plurality of S-cells embedded therein according to one or more embodiments described and illustrated herein.

Referring now to FIGS. 1 and 2, an example power electronics system 100 is illustrated in an assembled view and an exploded view, respectively. The power electronics system 100 illustrated by FIGS. 1 and 2 includes a cold plate 102 and a circuit board assembly 106. While not shown in FIGS. 1 and 2, in some embodiments a bond layer or a thermal grease layer may be disposed between the cold plate 102 and the circuit board assembly 106. The cold plate 102 may be any device capable of removing heat flux from power electronics devices 140 (see FIG. 3) coupled to or embedded within a cavity 103 of the cold plate 102 and/or coupled to or embedded within a substrate material of the circuit board assembly 106. Non-limiting examples for the cold plate 102 include heat sinks, single-phase liquid cooling, two-phase liquid cooling, and vapor chambers. FIGS. 1 and 2 illustrate the cold plate 102 has being configured as a single-phase liquid cooling device. The cold plate 102 includes a fluid inlet 132 and a fluid outlet 134 fluidly coupled to a fluid chamber 115 within the cold plate 102. While FIGS. 1 and 2 depict the fluid inlet 132 and the fluid outlet 134 as being on the same side of the cold plate 102, the present disclosure is not limited to such an embodiment. That is, in other embodiments, the fluid inlet 132 and the fluid outlet 134 may be positioned on other surfaces. For example, FIG. 6 depicts the fluid inlet 132 on a first surface and the fluid outlet 134 on a second surface that is opposite the first surface. Referring briefly to FIG. 3, cooling fluid (depicted as moving arrows 135) from a reservoir (not shown) flows into the fluid chamber 115 through the fluid inlet 132 and out of the fluid chamber 115 through the fluid outlet 134, where it is returned to the reservoir, such as after flowing through a heat exchanger (not shown) to remove heat from the cooling fluid. Although not shown, an array of fins may be provided in the fluid chamber 115 to provide additional surface area for heat transfer to the cooling fluid 135.

Referring again to FIGS. 1 and 2, the circuit board assembly 106 is coupled (e.g., affixed) to a first surface 107 of the cold plate 102. FIGS. 1 and 2 illustrate the circuit board assembly 106 as being affixed to the first surface 107 of the cold plate 102 by way of fasteners 101 (e.g., bolts and nuts) disposed through through-holes 105 of the cold plate 102 and through-holes 109 of the circuit board assembly 106. When fasteners 101 are used, a bond layer disposed between the cold plate 102 and the circuit board assembly 106 may be a thermal grease layer to lower the thermal resistance between the circuit board assembly 106 and cold plate 102. It is noted that such a bond layer configured as thermal grease will not have dedicated through-holes. It should be appreciated that such an embodiment as depicted in FIGS. 1 and 2 may be used particularly when an additional electrical component 130 (see FIG. 3) is coupled to the cold plate 102. If such a component is not included, the through-holes 105, 109 and fasteners 101 may be omitted, as described below.

In other embodiments, the circuit board assembly 106 is coupled (e.g., affixed) to the first surface 107 of the cold plate 102 by a bond layer disposed therebetween and configured as a solder layer. For example, the bottom surface of the circuit board assembly 106 may include a metal layer that enables the circuit board assembly 106 to be coupled (e.g., affixed) to the first surface 107 of the cold plate 102 by a solder layer. Other bonding methods may be utilized as well without departing from the scope of the present disclosure.

In still other embodiments, the circuit board assembly 106 may be 3D printed layers that are 3D printed directly on the cold plate 102 (e.g., 3D printed on the first surface 107 of the cold plate 102). It should be appreciated that in such embodiments, the 3D printed layers of the circuit board assembly 106 reduce overall thermal resistance. Other additive manufacturing processes for affixing the circuit board assembly 106 to the cold plate 102 are also contemplated and included within the scope of the present disclosure.

In still other embodiments, the circuit board assembly 106 may be laminated to the first surface 107 of the cold plate 102. In addition, via connections may be made between the various components of the circuit board assembly 106 and the power electronics device assemblies 120 (FIG. 3) using laser drilling. That is, the vias are drilled through the laminated circuit board assembly 106 to the top surface of each conductive layer and the power devices of the power electronics device assemblies 120. The vias are then filled with copper via an electroplating method to establish electrical connections between components.

Referring now to FIG. 3, a cross-sectional view of the example power electronics system 100 is illustrated. In the illustrated embodiment, an additional electrical component 130 is coupled (e.g., affixed) to a second surface of the cold plate 102. As a non-limiting example, the additional electrical component 130 may be a capacitor of an inverter circuit, for example. It should be understood that an additional electrical component 130 may not be affixed to the cold plate 102 in other embodiments.

The circuit board assembly 106 includes a substrate 111 made of an electrically insulating material. The electrically insulating material may be a material used in the fabrication of printed circuit boards, such as, without limitation, FR-4. The circuit board assembly 106 further includes embedded electrically conductive layers 110, a plurality of vias 112

(both electrically conducting vias and thermal vias). In some embodiments, the circuit board assembly 106 may also include a plurality of power electronics device assemblies 120 fully or partially embedded therein. However, the embodiment depicted in FIG. 3 shows the power electronics device assemblies 120 received within an S-cell 121 that is disposed within a cavity 103 of the cold plate 102, as described in greater detail herein.

As a non-limiting example, the cold plate 102 may include six cavities 103 therein for receiving six S-cells 121 and six power electronics device assemblies 120 for an inverter circuit for an electric vehicle. However, it should be understood that any number of S-cells and power electronics device assemblies may be utilized depending on the application.

Each power electronics device assembly 120 includes an S-cell 121 received within a cavity 103 of the cold plate 102 and a power electronics device 140 coupled (e.g., affixed) to the S-cell 121. As stated above, the S-cell 121 is a substrate to which the power electronics device 140 is bonded. The S-cell 121 provides an electrically conductive surface area to make connections to electrodes on the bottom surface of the power electronics device 140. The S-cell 121 further provides heat spreading functionality as well as electrical isolation. However, in some embodiments, an additional electrically insulating layer 180 may be interposed between the S-cell 121 and a base wall 104 of the cavity 103 of the cold plate 102 to provide additional electrical isolation, as described in further detail herein.

Figure 4:
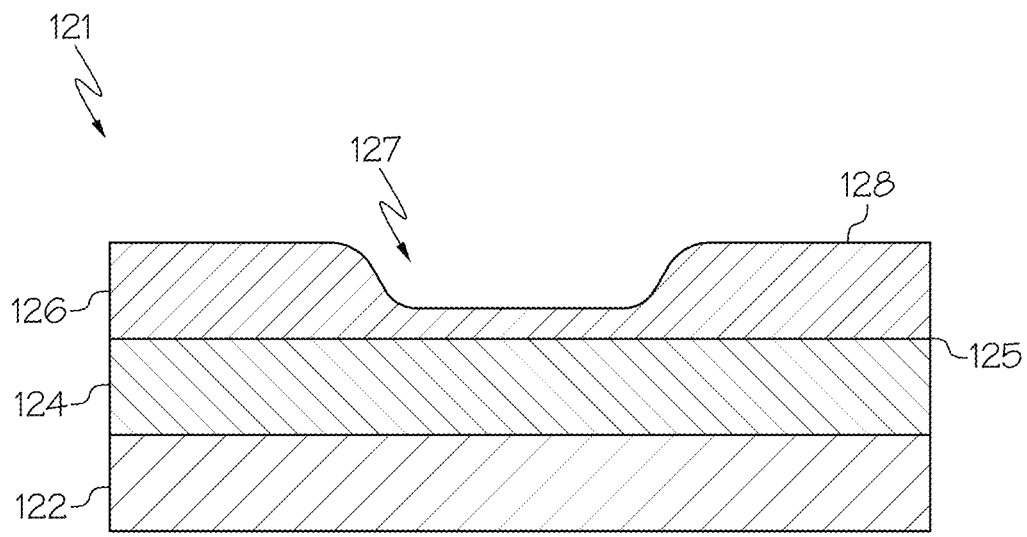
FIG. 4 schematically illustrates a cross-sectional view of an illustrative S-cell according to one or more embodiments described and illustrated herein.
Figure 5:
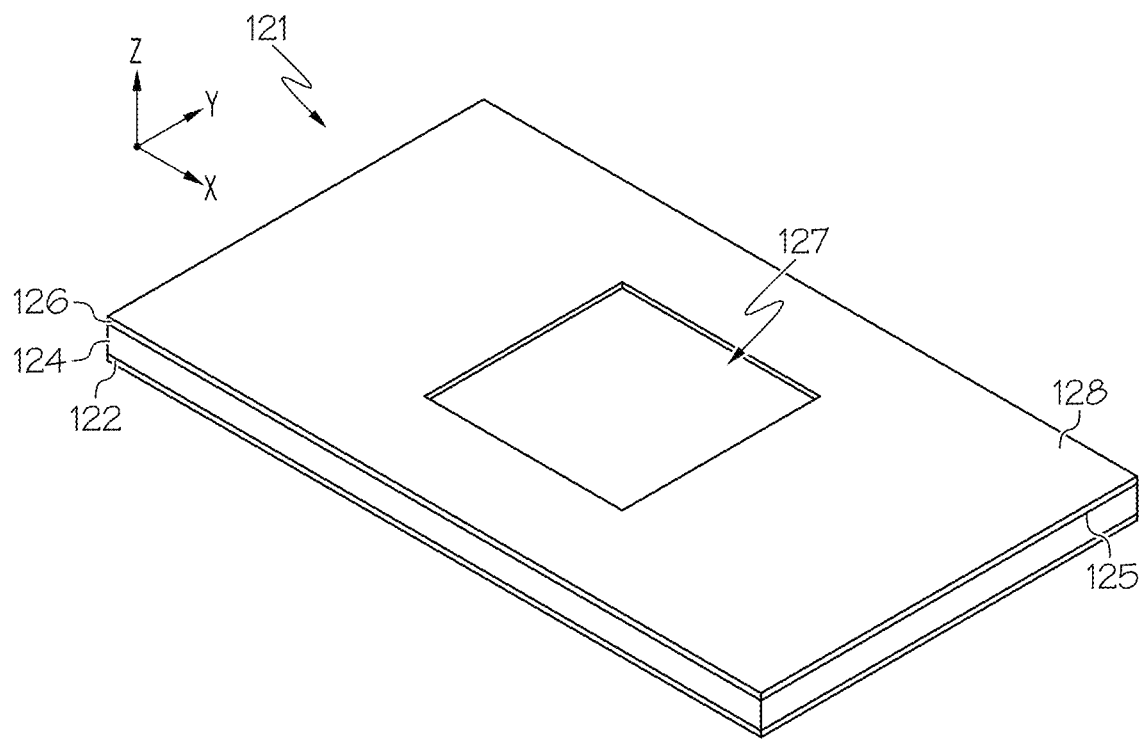
FIG. 5 schematically illustrates a perspective view of the S-cell of FIG. 4 according to one or more embodiments described and illustrated herein.

FIGS. 4 and 5 illustrate an example S-cell 121 in a cross-sectional view and a top perspective view, respectively. The S-cell 121 includes a plurality of stacked layers. Particularly, the S-cell 121 illustrated by FIGS. 4 and 5 include a first metal layer 122, a graphite layer 124, and a second metal layer 126. The second metal layer 126 includes a first face 125 and a second face 128, with a recess 127 disposed in the second face 128. The recess 127 is dimensioned to receive a power electronics device 140 (e.g., as shown in FIGS. 3 and 6). As described in more detail below, the second metal layer 126 provides an electrically conductive surface to which electrodes on a bottom surface of the power electronics device 140 (e.g., as shown in FIGS. 3 and 6) is connected (e.g., via a direct connection and/or via electrically connective vias). It should be appreciated that the various layers of the S-cell 121 depicted in FIGS. 4 and 5 is merely illustrative. That is, for example, the S-cell 121 may only have a plurality of graphite layers and/or other layers disposed between metal layers in some embodiments.

As a non-limiting example, the layers of the S-cell 121 may be bonded together with an RMS layer therebetween, similar to the various other RMS layers disclosed herein, or may be bonded via a high-temperature active metal brazing method that forms bond layers (i.e., active metal brazing layers). However, it should be understood that the various layers may be bonded using other known and yet-to-be-developed techniques.

It is noted that the illustrated S-cell 121 in the embodiment of FIGS. 4 and 5 includes the graphite layer 124 and a pair of metal layers (i.e., first metal layer 122 and second metal layer 126) to provide an S-cell 121 that is symmetrical along a z-axis of the coordinate axes depicted in FIG. 5. The symmetrical nature of the S-cell 121 balances forces on the S-cell during the high-temperature bonding process. Because the first and second metal layers 122, 126 and the graphite layer 124 have different coefficients of thermal expansion, it may be desirable to have a symmetrical substrate stack to balance the thermally induced stresses during the bonding process.

The first and second metal layers 122, 126 may be made of any suitable metal or alloy. Copper and aluminum may be used as the first and second metal layers 122, 126 as non-limiting examples.

The graphite layer 124 depicted in the embodiment of FIG. 5 is provided to encourage heat spreading both across the S-cell 121 as well as toward the cold plate 102 (see, e.g., FIG. 3). The crystalline structure of graphite provides the graphite with high thermal conductivity, making it useful to conduct heat flux toward the cold plate 102. However, graphite does not have an isothermal profile. Rather, graphite has an anisothermal profile with high conductivity along two axes and low thermal conductivity in a third axis. To account for the anisothermal profile of graphite, the S-cell 121 is designed to be rectangular in shape such that its length dimension is larger than its width dimension. Referring to FIG. 5, the graphite layer 124 has high thermal conductivity along the x-axis and the z-axis of the coordinate axes depicted in FIG. 5. Thus, the S-cell 121 is designed such that its dimension along the x-axis is larger than its dimension along the y-axis. Heat flux will travel along the x-axis and z-axis. As described in more detail below, heat flux is moved by the S-cell 121 along the x-axis toward the cold plate 102. Heat flux will also travel along the z-axis toward the cold plate 102.

The second metal layer 126 of the S-cell 121 has a recess 127 formed in the second face 128 thereof. The recess 127 may be formed by chemical etching, for example. The recess 127 has a size and shape to accept a power electronics device 140 (see, e.g., FIGS. 3 and 6). The second face 128 may generally be a second major face or surface of the second metal layer 126 that is opposite the first face 125 (which is configured as a first major face or surface of the second metal layer 126). That is, the second metal layer 126 may be a planar layer whereby the first face 125 faces the graphite layer 124 and the opposite second face 128 faces the power electronics device 140 and the circuit board assembly 106 (FIG. 3).

FIG. 6 illustrates a partial exploded view of a power electronics device assembly 146 including a power electronics device 140 and the cold plate 102 that includes an S-cell 121. FIG. 6 depicts the power electronics device 140 and a bonding layer 143 with respect to the recess 127 of the S-cell 121. The bonding layer 143 may be a solder layer, for example. As another example, the bonding layer 143 may be a transient liquid phase bonding layer 143. As yet another example, the bonding layer may be an additional RMS. Use of an additional RMS (e.g., an RMS foil or coating) between the power electronics device 140 and the S-cell 121 may further increase thermal flux from the power electronics device 140 to the cold plate 102. The power electronics device 140 includes a plurality of electrodes 141, 142 on its top surface. The large electrodes 141 may be power electrodes, while the smaller electrodes 142 may be signal electrodes. It is noted that, although not visible in FIG. 6, the power electronics device 140 further includes one or more electrodes on its bottom surface. The one or more electrodes on the bottom surface of the power electronics device are electrically connected to the second metal layer 126 by placement of the power electronics device 140 into the recess 127. Thus, electrical connection to the bottom electrodes of the power electronics device 140 may be made by way of the second metal layer 126.

Referring also to FIG. 3, electrical connection to the plurality of electrodes 141, 142 and the second metal layer 126 may be made by a plurality of vias 112. These vias 112 may provide drive signals to the power electronics devices 140, as well as provide a current path for switching current. It is noted that, in some embodiments, some of the vias 112 may be configured as thermal vias that do not conduct drive signals or switching current. In addition, the S-cell arrangement within the cavity 103 of the cold plate 102 allows for flux movement from the power electronics device 140 to the cold plate via the S-cell, as described herein. In this way, heat flux is optimally directed away from the power electronics devices 140 and toward the cold plate 102 via the S-cell. As shown in FIG. 3, cold cooling fluid 135 enters the cold plate 102 through the fluid inlet 132, flows through the fluid chamber 115, and exits as warmed cooling fluid out of the fluid outlet 134.

Still referring to FIGS. 3 and 6, the cavity 103 of the cold plate 102 may be shaped and/or sized to receive the S-cells 121 with the power electronics devices 140 embedded therein or coupled thereto, as described herein. As previously discussed herein, conventional IMS material has low thermal conductivity and results in decreased thermal flux from the S-cells 121 to the cold plate 102. Accordingly, at least one RMS 150 is utilized between each S-cell 121 and a base wall 104 of each cavity 103 of the cold plate 102 to bond the S-cell 121 to the cold plate 102 within the cavity 103. In some embodiments, a single RMS 150 may be interposed between the S-cell 121 and the base wall 104 of the cavity 103 of the cold plate 102. In other embodiments, such as the embodiment depicted in FIGS. 3 and 6, an electrically insulating layer 180 may be located between the S-cell 121 and the base wall 104 of the cavity 103 of the cold plate 102, and a first RMS 150 is interposed between the S-cell 121 and the electrically insulating layer 180 and a second RMS 150 is interposed between the electrically insulating layer 180 and the base wall 104 of the cavity 103 of the cold plate 102 to bond the S-cell 121 and the electrically insulating layer 180 to the cold plate 102 within the cavity 103 thereof. That is, a first RMS foil or coating may be positioned between the S-cell 121 and the electrically insulating layer 180 and a second RMS foil or coating may be position between the electrically insulating layer 180 and the base wall 104 of the cavity 103 of the cold plate 102.

The electrically insulating layer 180 may generally be any layer that provides electrical insulation, such as ceramic or the like. Since the ceramic on its own would not sufficiently form a bond with the RMS 150, the ceramic may be metalized (e.g., having a metal electrodeposited thereon) to provide a bonding surface to the RMS 150. That is, the ceramic may have a metallization layer disposed thereon. The metallization layer may be a layer that partially or fully surrounds the ceramic, and may have a thickness on the order of tens of nanometers. It should be appreciated that such a metallization layer promotes bonding between the ceramic and metallic portions (e.g., metal portions of an RMS layer). In some embodiments, the metallization layer may have an area with a footprint that is smaller than that of the ceramic so as to ensure the S-cell 121 is fully insulated from the cold plate 102.

Referring now to FIG. 7, a diagram of the RMS 150 showing a transition from a multilayer, unreacted state 162 to a reacted state 164 is depicted. The RMS 150 is generally placed in the unreacted state 162 between the components to be bonded (e.g., referring to FIGS. 3 and 6 as an example, between the S-cell 121 and the base wall 104 of the cavity 103 of the cold plate 102, between the S-cell 121 and the electrically insulating layer 180, between the S-cell 121 and the power electronics device 140, and/or between the electrically insulating layer 180 and the base wall 104 of the cavity 103 of the cold plate 102) and is ignited to start an exothermic reaction that results in a self propagating front. For example, an electrical spark 170 or the like may be applied to the RMS 150 to cause a self propagating front to move in direction D and transform the unreacted state 162 to the reacted state 164 in a reaction zone 160 whereby the material of the unreacted state 162 melts (depicted as part of a melting zone 166). The electrical spark 170 may produce localized heat up to about 1000° C. for a short period of time (e.g., a few milliseconds), and may result in a bond that has low thermal and residual stress bondings, allows for joining of similar and different materials, results in low leakage bondings, results in high thermal and electrical conductive connections, and can be applied in a vacuum, devoid of oxygen, and/or within fluids.

The material of the RMS 150 in the unreacted state 162 may include successive layers of a first material 156 and a second material 158 disposed between a first brazing solder layer 152 and a second brazing solder layer 154 (e.g., a metallic base supporting a plurality of alternating layers of reactant films thereon). Illustrative examples of the first material 156 include, but are not limited to, Titanium (Ti), Zirconium (Zr), Nickel (Ni), and Palladium (Pd). Illustrative examples of the second material 158 include, but are not limited to, Aluminum (Al) and Silicon (Si). In the reacted state 164, the first material 156 and the second material 158 may be reacted to form compounds such as TiAl, ZrAl, NiAl, TiSi, ZrSi, and PdAl between the first brazing solder layer 152 and the second brazing solder layer 154. The number layers of the first material 156 and the second material 158 in the unreacted state 162 is not limited by the present disclosure and may be any number of layers, such as for example, hundreds of layers. A period thickness of each layer may be, for example, from about 10 nanometers (nm) to about 150 nm in some embodiments. The total thickness of the RMS 150 may be from about 1 micrometer (μm) to about 100 μm in some embodiments.

In some embodiments, the RMS 150 may be produced using the Magnetron-Sputter-Deposition (MSD) process, and structuring may occur using processes such as, punching, cutting, and laser processing. In some embodiments, the RMS 150 may be formed to a particular size relative to the S-cell 121 (FIGS. 3-6) to ensure appropriate bonding of the S-cell 121. For example, the RMS 150 may have a length and/or a width that is greater than a length and/or a width of the S-cell 121 prior to a reaction process as described hereinabove so as to ensure the RMS 150 fully covers a bottom surface of the S-cell 121 after the reaction process as described herein to effectively bond the S-cell within the cavity 103 of the cold plate 102.

It should now be understood that embodiments of the present disclosure are directed to power electronics systems having a circuit board assembly coupled to a power electronics device assembly that includes a cold plate containing an S-cell. A power electronics device may be embedded within the S-cell and/or within the circuit board assembly. Such power electronics systems are compact, provide increased thermal conductivity while maintaining the ability to electrically insulate S-cells, thereby improving heat flux from the S-cell to the cold plate, thereby increasing heat spreading and cooling performance of the PCB relative to conventional packages.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed:

1. A cold plate, comprising:
   an S-cell disposed within a cavity of the cold plate; and
   at least one reactive multilayer system interposed between the S-cell and a base wall of the cavity.

2. The cold plate of claim 1, wherein the at least one reactive multilayer system comprises a metallic base and a plurality of alternating layers of reactant films stacked on the metallic base.

3. The cold plate of claim 1, wherein the at least one reactive multilayer system has a length and/or a width that is larger than a length and/or a width of the S-cell.

4. The cold plate of claim 1, further comprising an electrically insulating layer interposed between the S-cell and the base wall of the cavity.

5. The cold plate of claim 4, wherein the at least one reactive multilayer system comprises a first reactive multilayer system interposed between the S-cell and the electrically insulating layer and a second reactive multilayer system interposed between the electrically insulating layer and the base wall of the cavity.

6. The cold plate of claim 4, wherein the electrically insulating layer is formed of a metalized ceramic material.

7. The cold plate of claim 1, wherein the S-cell is constructed of graphite.

8. The cold plate of claim 1, further comprising a power electronics device embedded within a recess of the S-cell.

9. The cold plate of claim 8, wherein the power electronics device is bonded to the S-cell via an additional reactive multilayer system.

10. The cold plate of claim 1, further comprising a fluid chamber, a fluid inlet, and a fluid outlet, wherein the fluid inlet and the fluid outlet are thermally coupled to the fluid chamber.

11. A power electronics device assembly, comprising:
    a cold plate defining a cavity, the cold plate comprising:
    an S-cell disposed within the cavity of the cold plate and defining a recess, and
    at least one reactive multilayer system interposed between the S-cell and a base wall of the cavity, the at least one reactive multilayer system bonding the S-cell to the cold plate within the cavity; and
    a power electronics device received within the recess of the S-cell.

12. The power electronics device assembly of claim 11, wherein the power electronics device is bonded to the S-cell via an additional reactive multilayer system.

13. The power electronics device assembly of claim 11, wherein the at least one reactive multilayer system comprises a metallic base and a plurality of alternating layers of reactant films stacked on the metallic base.

14. The power electronics device assembly of claim 11, wherein the at least one reactive multilayer system has a length and/or a width that is larger than a length and/or a width of the S-cell.

15. The power electronics device assembly of claim 11, further comprising an electrically insulating layer interposed between the S-cell and the base wall of the cavity.

16. The power electronics device assembly of claim 15, wherein the at least one reactive multilayer system comprises a first reactive multilayer system interposed between the S-cell and the electrically insulating layer and a second reactive multilayer system interposed between the electrically insulating layer and the base wall of the cavity.

17. A power electronics system, comprising:
    a circuit board assembly; and
    a power electronics device assembly coupled to the circuit board assembly, the power electronics device assembly comprising:
    a cold plate defining a cavity, the cold plate comprising:
    an S-cell disposed within the cavity of the cold plate and defining a recess, and
    at least one reactive multilayer system interposed between the S-cell and a base wall of the cavity, the at least one reactive multilayer system bonding the S-cell to the cold plate within the cavity, and
    a power electronics device received within the recess of the S-cell.

18. The power electronics system of claim 17, wherein the power electronics device is bonded to the S-cell via an additional reactive multilayer system.

19. The power electronics system of claim 17, further comprising an electrically insulating layer interposed between the S-cell and the base wall of the cavity, wherein the at least one reactive multilayer system comprises a first reactive multilayer system interposed between the S-cell and the electrically insulating layer and a second reactive multilayer system interposed between the electrically insulating layer and the base wall of the cavity.

20. The power electronics system of claim 17, wherein:
    the cold plate is coupled to the circuit board assembly at a first surface thereof; and
    a capacitor is coupled to a second surface of the cold plate that is opposite from the first surface.

* * * * *